United States Patent [19]

Shimpuku et al.

[11] Patent Number: 5,600,315
[45] Date of Patent: Feb. 4, 1997

[54] MODULATING METHOD AND DEMODULATING APPARATUS

[75] Inventors: Yoshihide Shimpuku; Toshiyuki Nakagawa, both of Kanagawa, Japan

[73] Assignee: Sony Corporation, Tokyo, Japan

[21] Appl. No.: 245,360

[22] Filed: May 18, 1994

[30] Foreign Application Priority Data

May 21, 1993 [JP] Japan .................................. 5-119989

[51] Int. Cl.$^6$ .................................................. H03M 7/00
[52] U.S. Cl. ................................................ 341/59; 341/67
[58] Field of Search .................................. 341/58, 59, 67

[56] References Cited

U.S. PATENT DOCUMENTS

| | | | |
|---|---|---|---|
| 4,323,931 | 4/1982 | Jacoby | 360/40 |
| 4,728,929 | 3/1988 | Tanaka | 341/59 |
| 5,172,359 | 12/1992 | Sato | 369/59 |
| 5,270,714 | 12/1993 | Tanaka et al. | 341/59 |
| 5,428,356 | 6/1995 | Ozaki | 341/67 |
| 5,432,799 | 7/1995 | Shimpuku et al. | 371/37.1 |
| 5,451,943 | 9/1995 | Satomura | 341/58 |

FOREIGN PATENT DOCUMENTS

| | | |
|---|---|---|
| 0074656A2 | 3/1983 | European Pat. Off. . |
| 0094293A3 | 11/1983 | European Pat. Off. . |
| 0122027A1 | 3/1984 | European Pat. Off. . |
| 0178813A3 | 4/1986 | European Pat. Off. . |
| 0314512A2 | 5/1989 | European Pat. Off. . |
| 0405836A3 | 1/1991 | European Pat. Off. . |
| 0511498A2 | 11/1992 | European Pat. Off. . |
| 2111805 | 7/1983 | United Kingdom . |

*Primary Examiner*—Marc S. Hoff
*Attorney, Agent, or Firm*—Limbach & Limbach L.L.P.

[57] ABSTRACT

A modulation apparatus for converting digital data having the basic data length equal to $\underline{m}$ bits into a variable length code (d, k; m, n; r) having the basic codeword length of $\underline{n}$ bits is disclosed. The apparatus includes an encoder 12 for determining the constraint length $\underline{i}$ of data supplied from a shift register 11, based upon $\underline{m}$ bits as a unit, a selector 13, plural conversion tables $14_1$ and an unfixed bit processing circuit $16_1$. The selector 13 selects one of the conversion tables $14_1$ based upon the constraint length $\underline{i}$ and transmits m×i bit data to the selected conversion table $14_1$, which then converts the m×i bit data into n×i bit codewords. The unfixed bit processing circuit $16_1$ sets a bit at a preset position of a codeword among the codewords which gives an infinite value of the maximum run, or a bit at a preset position of a codeword among the codewords which has the maximum number of consecutive "0"s from the least significant bit towards upper order side bits, as being an unfixed bit, and sets the unfixed bit to "1" if $\underline{d}$ or more "0"s are consecutive to the unfixed bit. With the present modulation apparatus, the minimum length between transitions $T_{min}$ may be enlarged as compared to that in EFM for increasing the recording density, while the maximum length of transitions $T_{max}$ may also be increased as compared to that for VFM.

17 Claims, 3 Drawing Sheets

MODULATING METHOD AND DEMODULATING APPARATUS

BACKGROUND OF THE INVENTION

This invention relates to a modulating method and a demodulating apparatus and, more particularly, to a modulating method for modulating data so as to be suited to transmission or recording of data on a recording medium and a demodulation apparatus for reproducing the data by demodulating the modulated coded data resulting from the demodulation.

When transmitting the data or recording the data on the recording medium, such as a magneto-optical disc or an optical disc, the data are modulated so as to be suited for transmission or recording. Block coding has been known as one of such modulating techniques. The block coding consists of blocking an input data string into units (data words) each consisting of m×1 bits and translating the data words into codewords, each consisting of n×1 bits, in accordance with an appropriate coding rule. The block coding becomes a fixed length code if i=1 and becomes a variable length code if $i$ may assume multiple values, that is if i>1, with the maximum value of $i$ being $i_{max}$=r). The code produced by block coding is termed the variable length code (d, k; m, n; r), where $i$ is termed a constraint length, with $i_{max}$ being equal to the maximum constraint length $r$, $d$ is the minimum number of the same consecutive symbols, that is a so-called minimum run of O's, and $k$ is the maximum number of the same consecutive symbols, that is a so-called maximum run of O's.

When recording the variable length code on, for example, an optical disc, it is modulated into so-called non-return to zero code (NRZ code) and recorded based upon the NRZ modulated variable length code, referred to hereinafter as the recording waveform data string. With the minimum length between transitions and the maximum length between transitions of the recording waveform data string being $T_{min}$ and $T_{max}$, respectively, it is desirable from the viewpoint of the recording density that the minimum length between transitions $T_{min}$ be long, that is that the minimum run $d$ be large, while it is desirable from the viewpoint of clock reproduction and jitter that the maximum length between transitions $T_{max}$ be short, that is that the maximum run $k$ be small. A variety of modulation methods have been proposed with which the above conditions are met.

In the case of an optical disc having audio data recorded thereon, that is a so-called compact disc (CD), a so-called eight-to-fourteen modulation (EFM) is employed. This modulation method is a variable length code (2, 10; 8, 17; 1) in which, if the interval between bits (bit length) of the recording waveform data string is T, the minimum length, between transitions $T_{min}$ is (2+1)T or 3T. If the interval between bits of the data string is T1, the minimum length between transitions $T_{1min}$ is ((8/17)×3)$T_1$ or 1.41$T_1$. In the following description, the indication of the bit length T is directly followed by the bracketed indication of the corresponding bit length $T_1$. The maximum length between transitions $T_{max}$ ($T_{1max}$) is 11T (5.18$T_1$,), while the window margin $T_W$, which stands for the allowable jitter, is represented as (m/n)×T, and has a value equal to (8/17)T or 0.47T. With such a CD, it may be contemplated to diminish the minimum pit length corresponding to the minimum length between transitions $T_{min}$ ($T_{1max}$) on the optical disc. However, if the minimum pit length becomes excessively shorter than the spot size of the laser beam, it becomes difficult to detect the pits so that errors tend to be produced. On the other hand, limitations are imposed on increasing the recording density by diminishing the wavelength of the laser light source for diminishing the spot size.

With the above in view, there has also been developed a modulation method whereby the minimum pit length on the optical disc, that is the minimum length between transitions $T_{min}$ ($T_{1min}$), may be increased without diminishing the information volume.

For example, as shown in table 1, there has also been proposed a variable length code (4, 22; 2, 5; 5) in which the minimum length between transitions $T_{min}$ is increased to 5T (2$T_1$) for increasing the recording density as compared to EFM. This modulation method is referred to hereinafter as variable five modulation (VFM). With the VFM, the maximum length between transitions $T_{max}$ ($T_{1max}$) increased to 23T (9.2$T_1$,) as compared to the maximum length between transitions $T_{max}$ ($T_{1max}$) of EFM which is equal to 11T (5.18$T_1$,). That is, the VFM is not advantageous from the viewpoint of clock reproduction and jitter and renders the designing of the apparatus difficult.

TABLE 1a

| | data words | code words |
|---|---|---|
| i=1 | 11 | 00000 |
| | 10 | 10000 |
| | 111111 | 00001 00001 00000 |
| ii=2 | 0111 | 01000 00000 |
| | 0110 | 00100 00000 |
| | 0101 | 00010 00000 |
| | 0100 | 00001 00000 |
| i=3 | 001111 | 01000 01000 00000 |
| | 001110 | 01000 00100 00000 |
| | 001101 | 01000 00010 00000 |
| | 001100 | 01000 00001 00000 |
| | 001011 | 00010 00001 00000 |
| | 001010 | 00100 00100 00000 |
| | 001001 | 00100 00010 00000 |
| | 001000 | 00100 00001 00000 |
| | 000111 | 00010 00010 00000 |
| i=4 | 00011011 | 01000 01000 01000 00000 |
| | 00011010 | 01000 01000 00100 00000 |
| | 00011001 | 01000 01000 00010 00000 |
| | 00011000 | 01000 01000 00001 00000 |
| | 00010111 | 01000 00010 00001 00000 |
| | 00010110 | 01000 00100 00100 00000 |
| | 00010101 | 01000 00100 00010 00000 |
| | 00010100 | 01000 00100 00001 00000 |
| | 00010011 | 01000 00010 00010 00000 |
| | 00010010 | 00100 00100 00100 00000 |
| | 00010001 | 00100 00100 00010 00000 |
| | 00010000 | 00100 00100 00001 00000 |
| | 00001111 | 00010 00001 00001 00000 |
| | 00001110 | 00100 00001 00001 00000 |
| | 00001101 | 00100 00010 00010 00000 |
| | 00001100 | 00100 00010 00001 00000 |
| | 00001011 | 01000 00001 00001 00000 |
| | 00001010 | 00001 00001 00001 00000 |
| | 00001001 | 00010 00010 00010 00000 |
| | 00001000 | 00010 00010 00001 00000 |

TABLE 1b

| | data words | code words |
|---|---|---|
| i=5 | 0000011111 | 01000 01000 01000 01000 00000 |
| | 0000011110 | 01000 01000 01000 00100 00000 |
| | 0000011101 | 01000 01000 01000 00010 00000 |
| | 0000011100 | 01000 01000 01000 00001 00000 |
| | 0000011011 | 01000 01000 00010 00001 00000 |
| | 0000011010 | 01000 01000 00100 00100 00000 |
| | 0000011001 | 01000 01000 00100 00010 00000 |
| | 0000011000 | 01000 01000 00100 00001 00000 |

TABLE 1b-continued

| data words | code words |
| --- | --- |
| 0000010111 | 01000 01000 00010 00010 00000 |
| 0000010110 | 01000 00100 00100 00100 00000 |
| 0000010101 | 01000 00100 00100 00010 00000 |
| 0000010100 | 01000 00100 00100 00001 00000 |
| 0000010011 | 01000 00010 00001 00001 00000 |
| 0000010010 | 01000 00100 00001 00001 00000 |
| 0000010001 | 01000 00100 00010 00010 00000 |
| 0000010100 | 01000 00100 00010 00001 00000 |
| 0000001111 | 01000 01000 00001 00001 00000 |
| 0000001110 | 01000 00001 00001 00001 00000 |
| 0000001101 | 01000 00010 00010 00010 00000 |
| 0000001100 | 01000 00010 00010 00001 00000 |
| 0000001011 | 00100 00100 00010 00010 00000 |
| 0000001010 | 00100 00100 00100 00100 00100 |
| 0000001001 | 00100 00100 00100 00010 00000 |
| 0000001000 | 00100 00100 00100 00001 00000 |
| 0000000111 | 00100 00100 00010 00001 00000 |
| 0000000110 | 00100 00100 00001 00001 00100 |
| 0000000101 | 00100 00010 00010 00010 00000 |
| 0000000100 | 00100 00010 00010 00001 00000 |
| 0000000011 | 00100 00100 00010 00001 00000 |
| 0000000010 | 00100 00100 00001 00001 00000 |
| 0000000001 | 00100 00010 00010 00010 00000 |
| 0000000000 | 00100 00010 00010 00001 00000 |
| | 00010 00001 00001 00001 00000 |
| | 00001 00001 00001 00001 00000 |
| SYNC for mod2to4d5 | |
| ASYNC | 23T 21T 6T |
| BSYNC | 21T 23T 6T |

In other words, although it is necessary to increase the minimum length between transitions $T_{min}$ for increasing the recording density, it is necessary to reduce the maximum length between transitions $T_{max}$ simultaneously to as small a value as possible in order to assure the operating reliability of the apparatus. That is, a smaller value of the ratio of the maximum length between transitions to the minimum length between transitions is desirable. Specifically, the ratio $T_{max}/T_{min}=11T/3T=3.67$ for EFM, while the same ratio for VFM is 23T/5T=4.60.

In sum, while it is necessary to increase the minimum length between transitions $T_{min}$ ($T_{1min}$), that is the minimum run $\underline{d}$, of the variable length code produced on modulation in order to increase the recording density for a recording medium, such as an optical disc, the maximum length between transitions $T_{max}$ ($T_{1max}$), that is the maximum run $\underline{k}$, is undesirably increased with the conventional modulation methods.

SUMMARY OF THE INVENTION

In view of the above-described status of the art, it is a principal object of the present invention to provide a modulation method whereby the minimum run $\underline{d}$ may be enlarged as compared to that of EFM to assure high density recording, and the maximum run $\underline{k}$ may be diminished as compared to that of VFM, and a demodulating apparatus whereby the variable length code resulting from such modulation may be demodulated in order to reproduce the data.

According to a first modulation method of the present invention, data having a minimum run of 4 or more and a basic data length of $\underline{m}$ bits is converted into a variable length code (d, k; m, n; r) having a basic code length of $\underline{n}$ bits, which has a bit at a preset position of a codeword which has the possibility of giving an infinite number ($\infty$) for the maximum run $\underline{k}$ and a bit at a preset position of a codeword which gives the maximum number of "0"s consecutive from the LSB towards upper order bit side of the codeword is set as being an unfixed bit.

According to a second modulation method of the present invention, the unfixed bit as defined in the first modulation method is set to "1" when $\underline{d}$ or more bits are consecutive to the unfixed bit.

A modulation apparatus according to the present invention inversely converts the variable length code (d, k; m, n; r) having the minimum run $\underline{d}$ equal to 4 or more and the basic codeword length of $\underline{n}$ bits, and including an unfixed codeword having an unfixed bit at a preset position the value of which is determined by the number of "0"s consecutive to such bit, and includes detecting the codeword having the unfixed bit, means for determining the constraint length of the variable code depending on the results of detection by the unfixed codeword detection means, and inverse conversion means for inverse converting the variable length code into data based on the constraint length $\underline{i}$ from the constraint length decision means with the aid of inverse conversion tables of inverse converting n×i bit variable length code into m×i bit data.

With the first modulation method of the present invention, when converting data having the minimum run $\underline{d}$ of 4 or more and the basic data length of $\underline{m}$ bits into the variable length code (d, k; m, n; r) having the basic code length of $\underline{n}$ bits, the bit at a preset position of a codeword which is likely to give an infinite number ($\infty$) of the maximum run $\underline{k}$ and the bit at a preset position of a codeword which gives the maximum number of "0"s consecutive from its least significant bit towards the upper order bit side is an unfixed bit the value of which is fixed depending on the number of "0"s consecutive thereto.

With the second modulation method according to the present invention, the unfixed bit is set to "1" when $\underline{d}$ or more bits are consecutive to the unfixed bit.

In this manner, the minimum length between transitions $T_{min}$ may be increased to 5T from 3T for EFM, thereby improving the recording density. In addition, the distributions of the minimum length between transitions $T_{min}$ may be concentrated in the vicinity of 5T. On the other hand, the maximum length between transitions $T_{max}$ may be diminished to, for example, 19T, from 23T for VFM having the same value of the minimum length between transitions $T_{min}$, thereby simplifying the designing of the apparatus from the aspects of clock reproduction and jitter. In addition, the ratio of the maximum length between transitions to the minimum length between transitions may be reduced to 3.8 from 4.6 for VFM.

With the demodulation apparatus according to the present invention, in which the variable length code (d, k: m, n; r) having a minimum run $\underline{d}$ of 0.4 or more and the basic code length of $\underline{n}$ bits, and including a codeword having an unfixed bit the value of which is determined by the number of "0"s consecutive to the unfixed bit, is inverse converted into data having a basic data length of $\underline{m}$ bits, the codeword braving the unfixed bit is detected, and the constraint length $\underline{i}$ of the variable length code is determined based upon the results of detection. The variable length code is then inverse-converted into data, on the basis of the constraint length $\underline{i}$, with the aid of inverse conversion tables for inverse conversion of the n×i bit variable length code into m×i bit data. In this manner, the variable length code including variable length codeword may be demodulated into data. In addition, the inverse conversion tables for inverse conversion of the variable length code into data and hence the circuit scale may be reduced in size as compared to those of VFM, thereby decreasing the cost.

DESCRIPTION OF THE PREFERRED EMBODIMENTS

Figure 1:
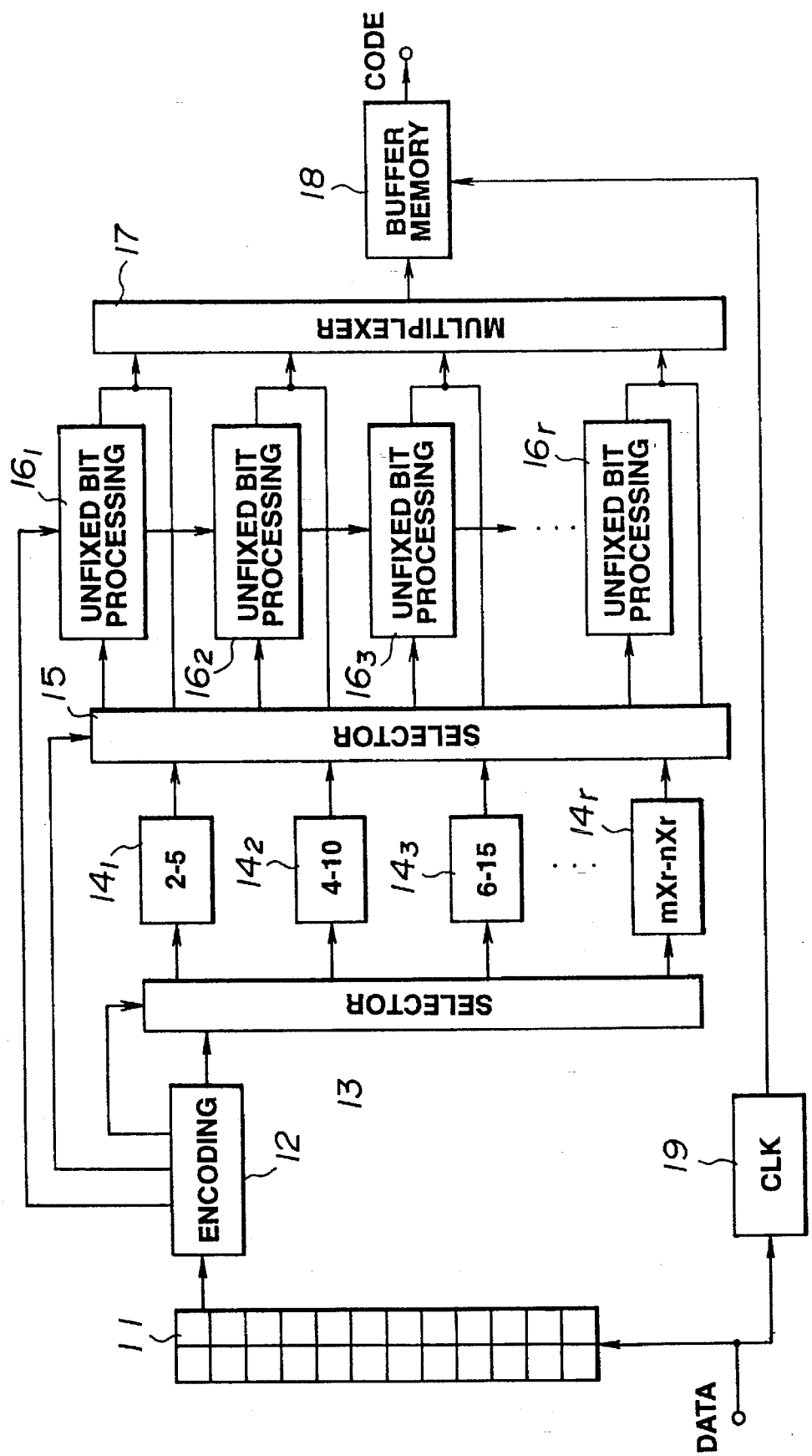
FIG. 1 is a block circuit diagram showing a circuit arrangement for a modulating apparatus according to the present invention.
Figure 3:
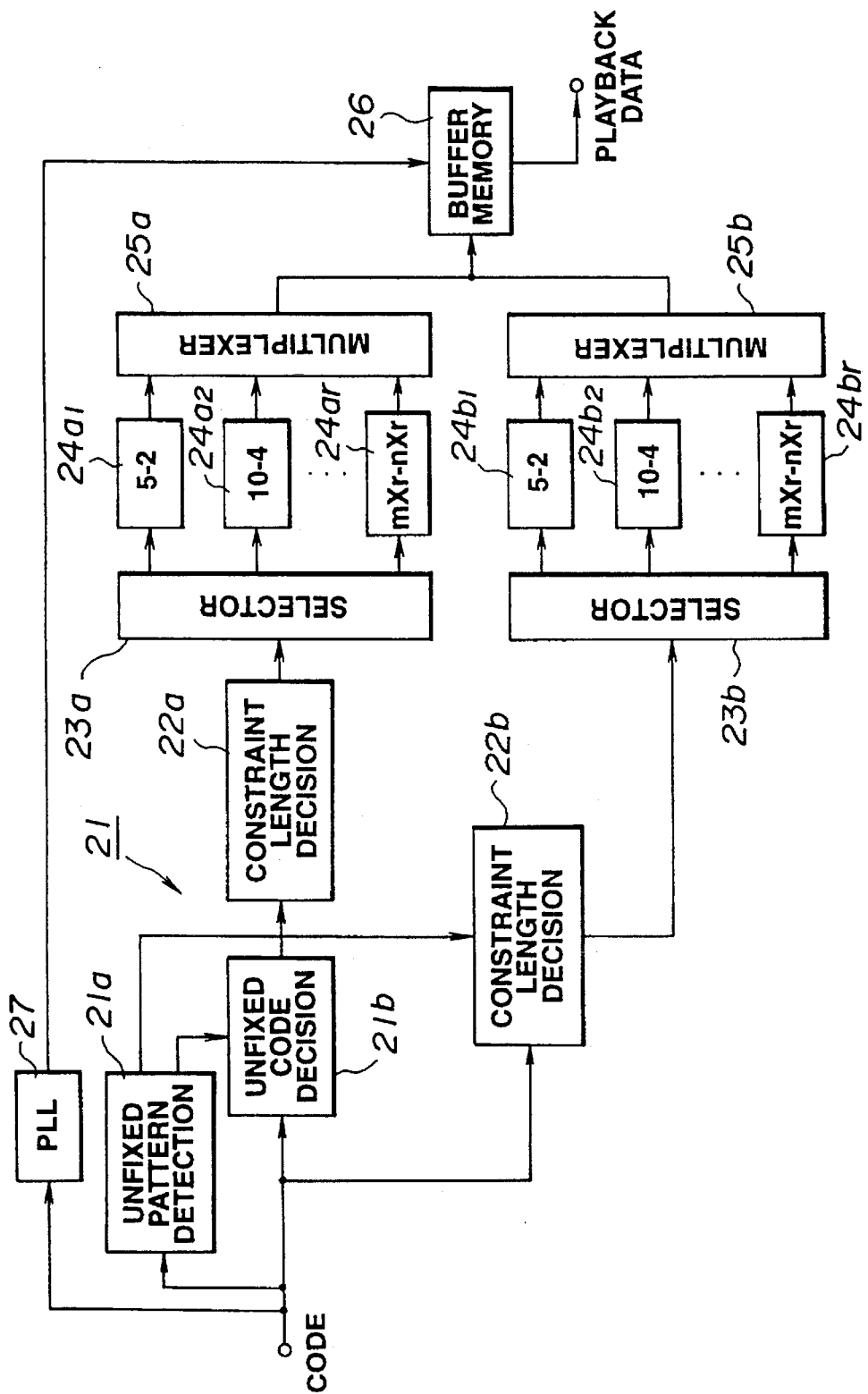
FIG. 3 is a block diagram showing a concrete circuit arrangement of a demodulating apparatus according to the represent invention.

Referring to the drawings, preferred embodiments of the modulating method and the demodulating apparatus according to the present invention are explained in detail. In these embodiments, the present invention is applied to a modulating apparatus for translating data into variable length code (d, k; m, n; r) and a demodulating apparatus for performing an inverse operation of the above-mentioned translating operation. FIGS. 1 and 3 illustrate circuit arrangements for the modulating apparatus and the demodulating apparatus, respectively.

Referring to FIG. 1, the modulating apparatus includes a shift register 11 for shifting data based on $m$ bits as a unit, and an encoding circuit 12 for discriminating the constraint length $i$ (i=1 to r) of data supplied from the shift register 11, based upon $m$ bits as a unit, and for detecting data which is to be transformed into a codeword including an unfixed bit, referred to hereinafter as an unfixed codeword. The apparatus also includes conversion tables aweigh, $i$ being 1 to r, for translating data having a minimum run $d$ of not less than four and a basic data length of $m$ bits into a variable length code (d, k; m, n; r) having a basic codeword length of $i$ bits, and a selector 13 for selecting one of the conversion tables $14_1$ based upon the constraint length $i$ from the encoding circuit 12 for supplying m×i bit data to the conversion tables $14_1$. The apparatus also includes an unfixed bit processing circuit $16_1$ for setting a bit of a pre-set position of a codeword from the conversion table $14_1$ which gives an infinite number (∞) of the maximum run $k$ and a bit of a pre-set position of a codeword from the conversion table $14_1$ having the maximum number of consecutive 0's from the least significant bit towards the upper order bit side and for setting the value of the unfixed bit to 1 when $d$ or more bits are consecutive to the unfixed bit, and a selector 15 for selecting one of the unfixed bit processing circuits $16_1$ based upon the results of detection from the encoding circuit 12 and supplying the unfixed bit to the selected one of the unfixed bit processing circuit $16_i$. The apparatus also includes a multiplexor 17 for commutatively selecting the codeword from the selector 15 or the codeword from the unfixed bit processing circuit $16_1$ for outputting the selected codeword as serial data, and a buffer memory 18 for temporarily storing the variable length codeword from the multiplexor 17 and outputting the stored codeword as the modulated codeword at a pre-set transfer rate. Finally, the apparatus includes a clock generator 19 for supplying clocks to the buffer memory 18.

Now, assuming that the variable length code (d, k; m, n; r) is the code (4, 18; 2, 5; 6), with a minimum d run of not less than 4, a maximum run $k$ of 0's equal to 18 bits, a basic data length $m$ of 2 bits, a basic codeword length $n$ of 5 bits and with a maximum constraint length $r$ of 6 bits. Then, as shown in Table 2, the conversion table $14_1$ is a conversion table for converting 2×1 bits or 2 bits, with the constraint length $i$ equal to 1, into the codeword having the length of 5×1 bits or 5 bits, referred to hereinafter as a 2–5 conversion table. The conversion table $14_2$ is a conversion table for converting 4 bits, with the constraint length $i$ equal to 2, into a 10-bit codeword, referred to hereinafter as a 4–10-conversion table. In a similar manner, the conversion tables $14_3$ to $14_6$ are a 6–15 conversion table, a 8–20 conversion table, 10–25 conversion table and a 12–30 conversion table, respectively.

In these conversion tables, some of the conversion tables have a codeword the maximum run $k$ of which becomes equal to ∞ if the unfixed bit is set to 0. An example is the conversion table $14_1$ (2–5 conversion table) that has a coding rule for converting data "01" in binary representation into a codeword "00*00" in which a bit as from the least significant bit (LSB) up to the m'th bit which, if set to 1, will give the least value of the maximum length of transition $T_{max}$, becomes an unfixed bit, where * is fixed to 1 or 0 depending on the number of 0's consecutive thereto. The conversion table $14_2$ (4–10 conversion table) has a coding rule of converting data "1011" into a codeword "00000 00*00". The conversion table including a codeword in which the number of 0's consecutive from the LSB towards the upper order side becomes maximum, such as the conversion table $14_4$ (8–20 conversion table), has a coding rule of converting data "00000100" into a codeword "00000 00000 00100 00*00". These conversion tables are implemented by, for example, a ROM in which the values of the codewords are previously stored with the data as addresses.

TABLE 2

| | data words | codewords |
|---|---|---|
| i=1 | 11 | 10000 |
| | 10 | 01000 |
| | 01 | 00*00 |
| i=2 | 0011 | 00010 00000 |
| | 0010 | 00001 00000 |
| | 1011 | 00000 00*00 |
| i=3 | 000111 | 00010 00010 00000 |
| | 000110 | 00010 00001 00000 |
| | 000101 | 00001 00001 00000 |
| | 000100 | 00000 00010 00000 |
| | 000011 | 00000 00001 00000 |
| i=4 | 00001011 | 00010 00010 00010 00000 |
| | 00001010 | 00010 00010 00001 00000 |
| | 00001001 | 00010 00001 00001 00000 |
| | 00001000 | 00001 00001 00001 00000 |
| | 00000111 | 00000 00010 00010 00000 |
| | 00000110 | 00000 00010 00001 00000 |
| | 00000101 | 00000 00001 00001 00000 |
| | 00000100 | 00000 00000 00100 00*00 |
| i=5 | 0000001111 | 01000 00000 00000 00010 00000 |
| | 0000001110 | 01000 00000 00000 00001 00000 |
| | 0000001101 | 00100 00000 00000 00010 00000 |
| | 0000001100 | 00100 00000 00000 00001 00000 |
| | 0000001011 | 00010 00010 00010 00010 00000 |
| | 0000001010 | 00010 00010 00010 00001 00000 |
| | 0000001001 | 00010 00010 00001 00001 00000 |
| | 0000001000 | 00010 00001 00001 00001 00000 |
| | 0000000111 | 00001 00001 00001 00001 00000 |
| | 0000000110 | 00000 00010 00010 00010 00000 |
| | 0000000101 | 00000 00010 00010 00001 00000 |
| | 0000000100 | 00000 00001 00001 00001 00000 |
| | 0000000011 | 00000 00001 00001 00001 00000 |
| | 0000000010 | 00000 00000 00100 00010 00000 |
| | 0000000001 | 00000 00000 00100 00001 00000 |
| i=6 | 000000000011 | 00010 00010 00010 00010 00010 00000 |
| | 000000000010 | 00010 00010 00010 00010 00001 00000 |
| | 000000000001 | 00010 00010 00010 00001 00001 00000 |
| | 000000000000 | 00010 00010 00001 00001 00001 00000 |

The shift register 11 is supplied with data obtained by processing video signals with data compression operations, such as predictive coding, discrete cosine transform, Huffman coding or the like. The shift register 11 shifts the input data, based upon $\underline{m}$ bits as a unit, and outputs the data to the encoding circuit 12.

The encoding circuit 12 discriminates the constraint length $\underline{i}$ of the input data supplied thereto based upon $\underline{m}$ bits as a unit. Specifically, the encoding circuit 12 checks if data supplied thereto on the 2-bit basis is presenting the data portion of the 2–5 conversion table shown in Table 2. That is, the encoding circuit determines the constraint length $\underline{i}$ to be 1 when the data is "11", "10" and "01" and, if the data is "00", it adds the next two bits to produce 4 bits, that is it shifts the input data to the next rank. If data "10" and data "11" are consecutive to each other in this order, the constraint length $\underline{i}$ is determined to be 2 in order to prevent the maximum run of the variable length code produced on conversion from becoming infinite ($\infty$).

The encoding circuit 12 checks if 4-bit data supplied thereto is present in a data portion of the 4–10 conversion table shown in Table 2. That is, the encoding circuit determines the constraint length $\underline{i}$ to be 2 when the data is "0011", "0010'" and "1011" and, if the data is "0001" or "0000", it shifts the input data to the next rank.

In a similar manner, the encoding circuit 12 determines the data portions of the 6–15 conversion table, 8–20 conversion table or the 10–25 conversion table in which the data supplied on the 2-bit basis from the shift register 11 is present, and accordingly determines the constraint length i=3 to 6.

The encoding circuit 12 also detects data "01", "1011" and "00000100" and detects these data as being data in which the codeword produced on conversion becomes an unfixed codeword.

The selector 13 then selects the conversion table 14$\underline{i}$ based upon the constraint length $\underline{i}$ supplied from the encoding circuit 12, and routes m×i bit data to the thus selected conversion table 14$\underline{i}$.

Specifically, the selector 13 selects the conversion table 14, when i=1 and routes 2-bit data "11", "10" and "01" to the thus selected conversion table 14$_i$.

The selector 13 selects the conversion table 1$_2$ when i=2 and routes 4-bit data "0011", "0010" and "1011" to the thus selected conversion table 14$_2$. If the data "10" and data "11" are consecutive in this order, the selector selects the conversion table 14$_2$ and routes 4-bit data "1011" to the conversion table 14$_2$.

In a similar manner, the selector 13 selects the conversion tables 14$_3$ to 14$_6$, associated with the value of the constraint length $\underline{i}$, if the constraint length $\underline{i}$ is 3 to 6, and routes 6–12 bit data to the thus selected conversion tables 14$_3$ to 14$_6$.

The conversion tables 14$_1$ to 14$_6$ have the 2–5, 4–10, 6–15, 8–20, 10–25 and 12–30 conversion tables, as explained hereinabove, and reads out the codewords of the codeword portion, using the data supplied via the selector 13 as the readout addresses.

The result is that if the data is "11", "10" and "01", the conversion table 14$_1$, outputs the codewords "10000", "01000" and an unfixed codeword "00*00", respectively If the data is "0011", "0010" and "1011", the conversion table 14$_2$ outputs the codewords "00010 00000", "00001 00000" and an unfixed codeword "00000 00*00", respectively.

If the data is "000111", "000110", "000011", the conversion table 14$_3$ outputs the codewords "00010 00010 00000", "00010 00001 00000",'. - "00000 00001 00000".

If the data is "00001011", "00001010 00000100", the conversion table 14$_4$ outputs the codewords "00010 00010 00010 00000", "00010 00010 00001 00000" and an unfixed codeword "00000 00000 00100 00*00", respectively.

If the data is "0000001111", "0000001110 0000000001" the conversion table 14$_5$ outputs the codewords "01000 00000 00000 00010 00000", "01000 00000 00000 00001 00000", "00000 00000 00100 00001 00000", respectively.

If the data is "000000000011" "000000000010". . . "000000000000", the conversion table 14$_6$ outputs the codewords "00010 00010 00010 00010 00010 00000", "00010 00010 00010 00010 00001 00000". . . "00010 00010 00001 00001 00001 00000", respectively.

That is, these conversion tables 14$_1$ to 14$_6$ output variable length codewords and route these codewords to the selector 15. The selector 15 selects the unfixed bit processing circuit 16j$_i$, based upon the results of detection of the unfixed codeword, supplied from the encoding circuit 12, and routes the unfixed codeword to the unfixed bit processing circuit 16$_j$, while routing the codewords other than the unfixed codeword to the multiplexor 17.

Specifically, the selector 15 selects, when supplied with an unfixed codeword "00*00" containing the unfixed bit "*", the unfixed bit processing circuit 16$_1$ based upon the results of detection of the unfixed codeword, and routes the unfixed codeword "00*00" to the unfixed bit processing circuit 16$_j$ When supplied with the unfixed codeword "00000 00*00", for example, the selector 15 selects the unfixed bit processing circuit 16$_2$, and routes the unfixed codeword "00000 00*00" to the unfixed bit processing circuit 16$_2$.

When supplied with the unfixed codeword "00000 00000 00100 00*00", for example, the selector 15 selects the unfixed bit processing circuit 16$_4$, and routes the unfixed codeword "00000 00000 00100 00*00" to the unfixed bit processing circuit 16$_4$.

The unfixed bit processing circuit 16, sets the unfixed bit of the unfixed codeword "00*00", that is the third bit as counted from the LSB being the first bit, to 1 when not less than $\underline{d}$ "0" bits are continuously adjacent to the unfixed bit. Specifically, if the unfixed codeword "00*00" is followed by the codeword "10000", the processing circuit 16$_i$, sets the unfixed codeword "00*00" fixedly to a codeword "00000". On the other hand, if the codeword "00010 00000" is followed by the unfixed codeword "00*00", the unfixed codeword is set fixedly to a codeword 00100.

Also the unfixed bit processing circuit 16$_2$ sets the unfixed codeword "00000 00*00" fixedly to a codeword "00000 00100" or to a codeword "00000 00000" depending on the number of "0"s consecutive to the unfixed bit.

Furthermore, the unfixed bit processing circuit 16$_4$ sets the unfixed codeword "00000 00000 00100 00*00" fixedly to a codeword "00000 00000 00100 00100" or to a codeword "00000 00000 00100 00000" depending on the number of "0"s consecutive to the unfixed bit.

The multiplexor 17 multiplexes the codeword from the selector 15 and the codeword fixed by the unfixed bit processing circuit 16$_j$ to produce serial data which is supplied to the buffer memory 18.

The buffer memory 18 transiently stores the codewords supplied thereto from the multiplexor 17 and outputs the stored codewords as the codewords at a pre-set transfer rate in relation to the clocks supplied from the clock generator 19.

That is, if the bit length of the NRZI modulated variable length codeword, referred to herein as the recording waveform data string, is T, the minimum length between transitions $T_{min}$ with the variable length code (4, 18; 2, 5; 6) of the present embodiment is (4+1)T or 5T. The maximum length between transitions $T_{max}$ is (18+1)T or 19T, while the window margin $T_W$, which gives an allowable jitter value represented by (m/n)×T, has a value equal to 2/5T or 0.4T. The ratio of the maximum length between transitions to the minimum length between transitions, as referred to in connection with the prior art, is 3.8 ($T_{max}/T_{min}$=19T/5T).

Figure 2:
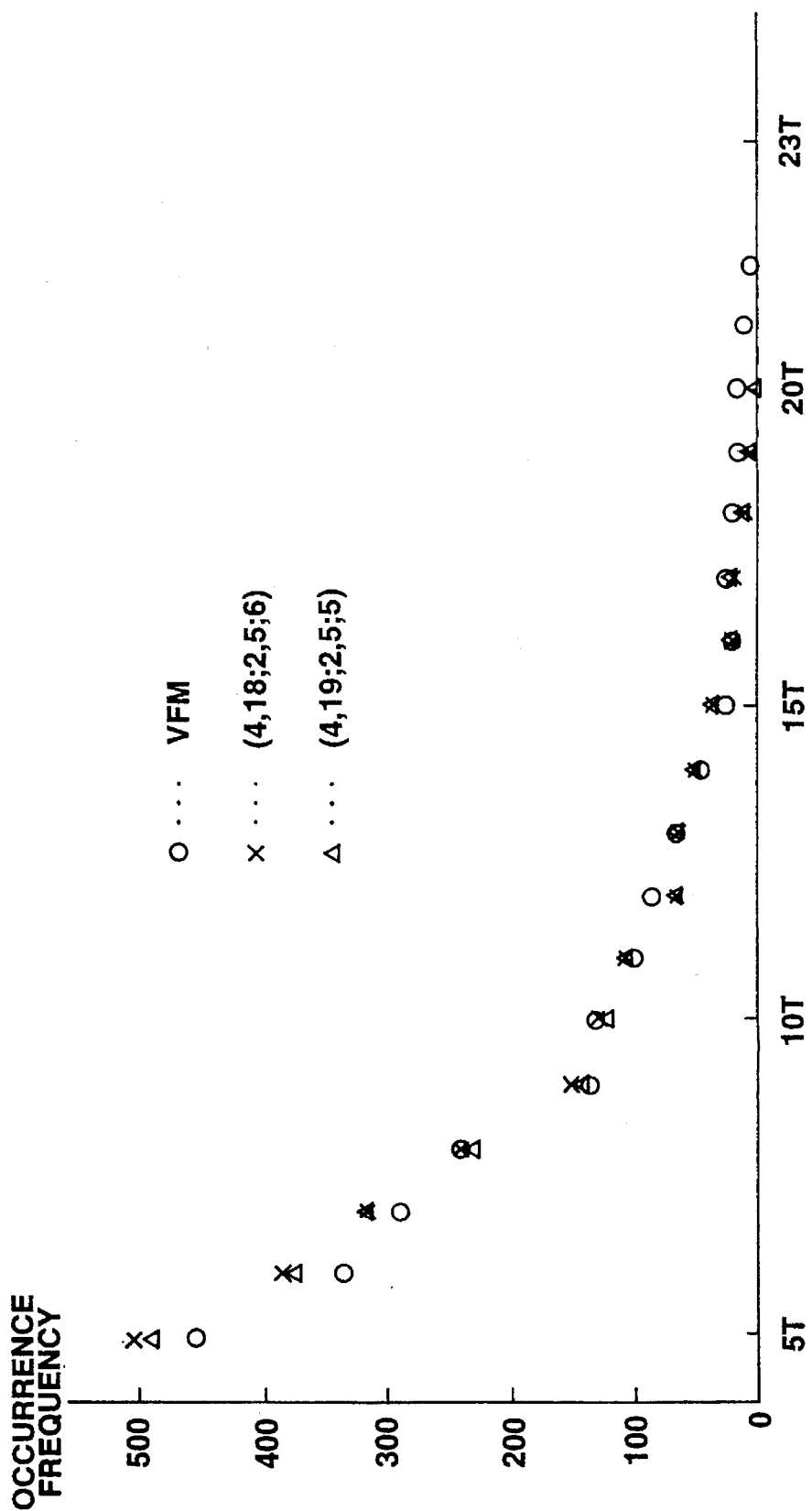
FIG. 2 is a graph showing the distribution of the transition lengths with the modulating method according to the present invention as compared to that with the conventional VFM.

In other words, with the present variable length code (4, 18; 2, 5; 6), the minimum length between transitions $T_{min}$ may be increased to 5T from the minimum length between transitions $T_{min}$ of the eight to fourteen modulation (EFM), that is the variable length code (2, 10; 8, 17; 1), which is 3T, thus improving the recording density. In addition, the distribution of the minimum length between transitions $T_{min}$ may be concentrated in the vicinity of 5T, as shown for example in Table 3 and FIG. 2. Specifically, as shown in FIG. 2, the occurrences of 5T and 6T may be increased by approximately 17% and 14%, respectively, as compared to those in the case of variable five modulation (VFM). That is, for a variable length code (4, 22; 2, 5; 5) referred to in connection with the prior art, the mean length between transitions, which is the total number of bits divided by the number of times of transitions, may be decreased to 7.82 from 8.21 for VFM.

TABLE 3

| length between transitions | VFM | (4,18; 215; 6) | (4,19; 2,5; 5) |
|---|---|---|---|
| 5T | 423 | 505 | 495 |
| 6T | 336 | 383 | 378 |
| 7T | 292 | 312 | 314 |
| 8T | 242 | 238 | 236 |
| 9T | 147 | 152 | 154 |
| 10T | 132 | 125 | 126 |
| 11T | 102 | 106 | 107 |
| 12T | 82 | 66 | 68 |
| 13T | 61 | 63 | 63 |
| 14T | 44 | 51 | 49 |
| 15T | 23 | 32 | 32 |
| 16T | 23 | 20 | 22 |
| 17T | 21 | 17 | is |
| 18T | 20 | 6 | 9 |
| 19T | 12 | 2 | 2 |
| 20T | 10 |  | 1 |
| 21T | 4 |  |  |
| 22T | 2 |  |  |
| 23T | 0 |  |  |
| number of times of transition | 1985 | 2078 | 2071 |
| number of bits | 16300 | 16255 | 16280 |
| mean length between transitions | 8.21 | 7.82 | 7.86 |

In addition, with the present variable length code (4, 18; 2, 5; 6), the maximum length between transitions $T_{max}$ may be diminished to 19T, as compared to the maximum length between transitions $T_{max}$ equal to 23T for VFM having the same value for the minimum length between transitions $T_{min}$. The design of the apparatus is thereby simplified from the standpoint of clock reproduction and jitter. Further, the ratio of the maximum length between transitions to the minimum length between transitions may be diminished to 3.8 as compared to the value of the same ratio of 4.6 for VFM.

Also, as may be seen from tables 1 and 2, the conversion tables $14_1$ to $14_6$ of the variable length code (4, 18; 2, 5; 6) may be rendered smaller than those for VFM.

It is also noted that, if the bit length of the data string is $T_1$, the minimum length between transitions $T_{1min}$ and the maximum length between transitions $T_{1max}$, based on the bit length $T_1$, as a reference, are 2.0$T_1$, and 7.6$T_1$, respectively.

The modulation method according to the present invention is not limited to the above-described embodiment. For example, the variable length code may also be a variable length code (4, 19; 2, 5; 5) which is inclusive of unfixed bits such as those in unfixed codewords "00*00", "00000 00*00", "00000 00000 00100 00*00" and "00000 00000 00010 000*0" and which is made up of a 2–5 , 4–10. 6–15, 8–20 and 10–25 conversion tables. In this case, the minimum length between transitions $T_{min}$, the maximum length between transitions $T_{max}$, window margin $T_W$ and the ratio of the maximum length between transitions to the minimum length between transitions are equal to 5T (2.0$T_i$, 20T (8.0$T_1$,), 0.4 and 4.0, respectively, such that the maximum length between transitions $T_{max}$ and the ratio of $T_{max}$ to $T_{min}$ may be smaller than those for VFM.

Table 4 shows another example of the conversion tables, which may be employed in the modulation method according to the present invention.

TABLE 4

|  | data words | codewords |
|---|---|---|
| i=1 | 11 | 10000 |
|  | 10 | 01000 |
|  | 01 | 00*00 |
| i=2 | 0011 | 00010 00000 |
|  | 0010 | 00001 00000 |
|  | 1011 | 00000 00*00 |
| i=3 | 000111 | 00010 00010 00000 |
|  | 000110 | 00010 00001 00000 |
|  | 000101 | 00001 00001 00000 |
|  | 000100 | 00000 00010 00000 |
|  | 000011 | 00000 00001 00000 |
| i=4 | 00001011 | 00010 00010 00010 00000 |
|  | 00001010 | 00010 00010 00001 00000 |
|  | 00001001 | 00010 00001 00001 00000 |
|  | 00001000 | 00001 00001 00001 00000 |
|  | 00000111 | 00000 00010 00010 00000 |
|  | 00000110 | 00000 00010 00001 00000 |
|  | 00000101 | 00000 00001 00001 00000 |
|  | 00000100 | 00000 00000 00100 00*00 |
|  | 00000011 | 00000 00000 00010 000*0 |
| i=5 | 0000001011 | 00010 00010 00010 00010 00000 |
|  | 0000001010 | 00010 00010 00010 00001 00000 |
|  | 0000001001 | 00010 00010 00001 00001 00000 |
|  | 0000001000 | 00010 00001 00001 00001 00000 |
|  | 0000000111 | 00001 00001 00001 00001 00000 |
|  | 0000000110 | 00000 00010 00010 00010 00000 |
|  | 0000000101 | 00000 00010 00001 00001 00000 |
|  | 0000000000 | 00000 00010 00001 00001 00000 |
|  | 0000000011 | 00000 00001 00001 00001 00000 |
|  | 0000000010 | 00000 00000 00100 00010 00000 |
|  | 0000000001 | 00000 00000 00100 00001 00000 |
|  | 0000000000 | 00000 00000 00010 00001 00000 |

The other embodiments of the conversion tables applicable for the modulation method according to the present invention are hereinafter explained.

Table 5 also shows a conversion table of the variable length code (4, 18; 2, 5; 5), which represents an example in which the size is reduced by employing a large number of unfixed bits *.

TABLE 5

|  | data words | codewords |
|---|---|---|
| i=1 | 11 | 10000 |
|  | 10 | 01000 |
|  | 01 | 00*00 |
| i=2 | 0011 | 00010 00000 |

TABLE 5-continued

| | data words | codewords |
|---|---|---|
| | 0010 | 00001 00000 |
| | 1011 | 00000 00*00 |
| i=3 | 000111 | 00010 00010 00000 |
| | 000110 | 00010 00001 00000 |
| | 000101 | 00001 00001 00000 |
| | 000100 | 00000 00010 00000 |
| | 000011 | 00000 00001 00000 |
| i=4 | 00001011 | 00010 00010 00010 00000 |
| | 00001010 | 00010 00010 00001 00000 |
| | 00001001 | 00010 00001 00001 00000 |
| | 00001000 | 00001 00001 00001 00000 |
| | 00000111 | 00000 00010 00010 00000 |
| | 00000110 | 00000 00010 00001 00000 |
| | 00000101 | 00000 00001 00001 00000 |
| | 00000100 | 00000 00000 00100 0000* |
| i=5 | 0000001111 | 00010 00010 00010 00010 00000 |
| | 0000001110 | 00010 00010 00010 00001 00000 |
| | 0000001101 | 00010 00010 00001 00001 00000 |
| | 0000001100 | 00010 00001 00001 00001 00000 |
| | 0000001011 | 00001 00001 00001 00001 00000 |
| | 0000001010 | 00000 00010 00010 00010 00000 |
| | 0000001001 | 00000 00010 00010 00001 00000 |
| | 0000001000 | 00000 00010 00001 00001 00000 |
| | 0000000111 | 00000 00000 00100 00100 0000* |
| | 0000000110 | 00000 00000 00100 00000 00000 |
| | 0000000101 | 10000 00000 00000 00010 00000 |
| | 0000000100 | 10000 00000 00000 00001 00000 |
| | 0000000011 | 01000 00000 00000 00010 00000 |
| | 0000000010 | 01000 00000 00000 00001 00000 |
| | 0000000001 | 00100 00000 00000 00010 00000 |
| | 0000000000 | 00100 00000 00000 00001 00000 |

Table 6 shows a conversion table for the variable length code (4, 19; 2, 5; 6). Although the size is enlarged as compared to those shown in tables 2 and 4, the number of unfixed bits * is diminished to avoid complexity of operation in order to achieve a more favorable hardware configuration TABLE 6a

| | data words | codewords |
|---|---|---|
| i=1 | 11 | 10000 |
| | 10 | 01000 |
| | 01 | 000*0 |
| i=2 | 0111 | 00100 00000 |
| | 0010 | 00001 00000 |
| | 1011 | 00000 000*0 |
| i=3 | 000111 | 00100 00100 00000 |
| | 000110 | 00100 00010 00000 |
| | 000101 | 00100 00001 00000 |
| | 000100 | 00001 00001 00000 |
| | 000011 | 00000 00001 00000 |
| i=4 | 00001011 | 00100 00100 00100 00000 |
| | 00001010 | 00100 00100 00010 00000 |
| | 00001001 | 00100 00100 00001 00000 |
| | 00001000 | 00100 00010 00000 00000 |
| | 00000111 | 00100 00010 00001 00000 |
| | 00000110 | 00100 00001 00001 00000 |
| | 00000101 | 00001 00001 00001 00000 |
| | 00000100 | 00000 00001 00001 00000 |

TABLE 6b

| | data words | codewords |
|---|---|---|
| i=5 | 0000001111 | 00100 00100 00100 00100 00000 |
| | 0000001110 | 00100 00100 00100 00010 00000 |
| | 0000001101 | 00100 00100 00100 00001 00000 |
| | 0000001100 | 00100 00100 00010 00010 00000 |
| | 0000001011 | 00100 00100 00010 00001 00000 |
| | 0000001010 | 00100 00100 00001 00001 00000 |
| | 0000001001 | 00100 00010 00010 00010 00000 |

TABLE 6b-continued

| | data words | codewords |
|---|---|---|
| | 0000001000 | 00100 00010 00001 00001 00000 |
| | 0000000111 | 00100 00010 00001 00001 00000 |
| | 0000000110 | 00100 00001 00001 00001 00000 |
| | 0000000101 | 00001 00001 00001 00001 00000 |
| | 0000000100 | 00000 00001 00001 00001 00000 |
| i=6 | 000000001111 | 00100 00100 00100 00100 00100 00000 |
| | 000000001110 | 00100 00100 00100 00100 00010 00000 |
| | 000000001101 | 00100 00100 00100 00100 00001 00000 |
| | 000000001100 | 00100 00100 00100 00010 00010 00000 |
| | 000000001011 | 00100 00100 00100 00010 00001 00000 |
| | 000000001010 | 00100 00100 00100 00001 00001 00000 |
| | 000000001001 | 00100 00100 00010 00010 00010 00000 |
| | 000000001000 | 00100 00100 00010 00010 00001 00000 |
| | 000000000111 | 00100 00100 00010 00001 00001 00000 |
| | 000000000110 | 00100 00100 00001 00001 00001 00000 |
| | 000000000101 | 00100 00010 00010 00010 00010 00000 |
| | 000000000100 | 00100 00010 00010 00010 00001 00000 |
| | 000000000011 | 00100 00010 00010 00001 00001 00000 |
| | 000000000010 | 00100 00010 00001 00001 00001 00000 |
| | 000000000001 | 00100 00001 00001 00001 00001 00000 |
| | 000000000000 | 00001 00001 00001 00001 00001 00000 |

Table 7 shows a conversion table for the variable length code (4, 20; 2, 5; 5). Although $T_{max}$ becomes larger than that with the other codes, the size may be reduced.

TABLE 7

| | data words | codewords |
|---|---|---|
| i=1 | 11 | 10000 |
| | 10 | 01000 |
| | 01 | 0000* |
| i=2 | 0011 | 00100 00000 |
| | 0010 | 00010 00000 |
| | 1011 | 00000 0000* |
| i=3 | 000111 | 00100 00100 00000 |
| | 000110 | 00100 00010 00000 |
| | 000101 | 00100 00001 00000 |
| | 000100 | 00010 00010 00000 |
| | 000011 | 00010 00001 00000 |
| i=4 | 00001011 | 00100 00100 00100 00000 |
| | 00001010 | 00100 00100 00010 00000 |
| | 00001001 | 00100 00100 00001 00000 |
| | 00001000 | 00100 00010 00010 00000 |
| | 00000111 | 00100 00010 00001 00000 |
| | 00000110 | 00100 00010 00010 00000 |
| | 00000101 | 00100 00010 00001 00000 |
| | 00000100 | 00010 00010 00010 00000 |
| | 00000011 | 00010 00010 00010 00000 |
| | 00000010 | 00010 00001 00001 00000 |
| i=5 | 0000000111 | 00100 00100 00100 00100 00000 |
| | 0000000110 | 00100 00100 00100 00010 00000 |
| | 0000000101 | 00100 00100 00100 00001 00000 |
| | 0000000100 | 00100 00100 00010 00010 00000 |
| | 0000000011 | 00100 00100 00010 00001 00000 |
| | 0000000010 | 00100 00100 00001 00001 00000 |
| | 0000000001 | 00100 00010 00010 00010 00000 |
| | 0000000000 | 00100 00010 00010 00001 00000 |

The modulation apparatus is hereinafter explained.

The present demodulation apparatus includes an unfixed codeward detection circuit 21 for detecting a codeword including an unfixed bit from the variable length code (d, k; m, n; r) having a minimum run $\underline{d}$ of 4 and a basic codeword length of $\underline{n}$ bits, with the unfixed bit being at a pre set position as determined by the number of "0"s consecutive to the preset bit position, and constraint length determining circuits 22a, 22b, for determining the constraint length $\underline{i}$ of the variable length code based upon the results of detection by the unfixed codeword detection circuit 21. The apparatus also includes inverse conversion tables $24a_i$, $24b_1$ for inverse conversion of the n×i bits of the variable length code into m×i data, where i=1 to r, and selectors 23a, 23b for selecting the inverse conversion tables 24$a_i$, 24$b_i$ based upon the constraint length $i$ from the constraint length determining circuits 22a, 22b and supplying the n×i bit variable length codewords to the selected inverse conversion tables 24ai, 24$b_i$. The apparatus also includes multiplexors 25a, 25b for commutatively selecting data from the inverse conversion tables 24$a_i$, 24$b_1$ and outputting the selected data as serial data, and a buffer memory 26 for transiently storing data from the multiplexors 25a and 25b and outputting the stored data as playback data. Finally, the apparatus includes a phase locked loop (PLL) 27 for reproducing clocks based upon the variable length code and supplying the clocks to the buffer memory 26.

Assuming that the variable length code (d, k; m, n; r) is the variable length code (4, 19; 2, 5; 5) in which the minimum run $\underline{d}$ is 4 bits, the maximum run $\underline{k}$ is 19 bits, the basic data length $\underline{m}$ is 2 bits, the basic codeword length $\underline{n}$ is 5 bits and the maximum constraint length $\underline{r}$ is 5, the inverse conversion tables 24$a_1$, 24$b_1$, on the whole are inverse conversion tables corresponding to the 2–5 conversion tables shown in table 4, i.e., is inverse conversion tables each having a constraint length $\underline{i}$ equal to 1 and adapted for converting a 5-bit codeword into 2-bit data, referred to hereinafter as 5–2 conversion tables. Of these inverse conversion tables, the inverse conversion table 24$a_1$, is for codewords liable to unfixed codewords, that is codewords in which five bits as counted from the MSB are "00000" or "00100", whereas the inverse conversion table 24$b_1$ for other codewords, that is codewords in which five bits as counted from the MSB are "10000" or "01000".

On the other hand, the inverse conversion tables 24$a_2$, 24$b_2$ on the whole are inverse conversion tables corresponding to the 4–10 conversion tables shown in table 4, that is inverse conversion tables each having a constraint length $\underline{i}$ equal to 2 and adapted for converting a 10-bit codeword into 4-bit data, referred to hereinafter as 10–4 inverse conversion tables. Of these inverse conversion tables, the inverse conversion table 24$a_2$ is for codewords liable to unfixed codewords, that is a codeword in which five bits as counted from the MSB are "00000", "00001" whereas the inverse conversion, tables 24$b_2$ is for other codewords, that is codewords in which five bits as counted from the MSB are "00010, "00001".

In a similar manner, the inverse conversion tables 24$a_3$ and 24$b_3$ comprise 15–6 inverse conversion tables having a constraint length $\underline{i}$ equal to 3 and adapted for converting 15-bit codewords into 6-bit data, while the inverse conversion tables 24$a_4$, 24$b_4$ comprise 20–8 inverse conversion tables having a constraint length $\underline{i}$ equal to 4 and adapted for converting 20-bit codewords into 8-bit data, and the inverse conversion tables 24$a_5$, 24$b_5$ comprise 25–10 inverse conversion tables having a constraint length $\underline{i}$ equal to 5 and adapted for converting 25-bit codewords into 10-bit data.

Referring to FIG. 3, the unfixed-bit detection circuit 21 is made up of an unfixed pattern detection circuit 21a for detecting a 5-bit pattern including an unfixed bit, referred to hereinafter as an unfixed pattern, and an unfixed codeword decision circuit 21b for detecting the unfixed codeword based upon the results of detection from the unfixed pattern detection circuit 21a, These circuits are fed with variable length codewords corresponding to the data reproduced from the recording medium and subsequently processed with NRZI demodulation, error correction or the like.

The unfixed pattern detection circuit 21a detects the unfixed patterns based upon a group of 5 bits from the leading end as a unit of detection. Specifically, there are two patterns likely to unfixed patterns, that is patterns "00000" and "00100". The detection circuit 21a detects these patterns "00000" and "00100" and routes the results of detection to the unfixed codeword discrimination circuit 21b.

When the unfixed codeword discrimination circuit 21b detects the pattern "00100", it determines the pattern to be an unfixed codeword "00*00". When the discrimination circuit detects the pattern "00000", it combines the pattern with the next 5-bit pattern to produce a 10-bit pattern and checks if the 10-bit pattern corresponds to patterns "00000 10000", "00000 01000" or "00000 00100". If the 10-bit pattern corresponds to the patterns "00000 10000" or "00000 01000', the discrimination circuit determines the first 5-bit pattern "00000" to be an unfixed codeword "00*00". If the 10-bit pattern corresponds to the pattern "00000 00100", the discrimination circuit determines the 10-bit pattern "00000 00100" to be an unfixed codeword "00000 00*00".

In a similar manner, the discrimination circuit 21b detects unfixed codewords, such as "00000 00000 00100 00*00" or "00000 00000 00010 000*0" as it appends 5 bits each time, and routes the results of detection of the unfixed codeword to the constraint length decision circuits 22a, 22b.

Based upon the results of detection of the unfixed codewords, supplied from the unfixed codeword discrimination circuit 21b, the constraint length discrimination circuits 22a and 22b determine the constraint length $\underline{i}$ of the unfixed codeword and the constraint length $\underline{i}$ of the codewords other than the unfixed codewords, respectively.

Based upon the constraint length $\underline{i}$ from the constraint length discrimination circuits 22a, 22b, the selectors 23a, 23b select the inverse conversion tables 24$a_i$, 24$b_1$ and routes n×i bit variable length codewords to the thus selected inverse conversion tables 24$a_i$, 24b.

Specifically, when i=1, for example, the selector 23a selects the inverse conversion table 24$a_1$ and routes 5-bit codewords 00000" or "00100" to the thus selected inverse conversion table 24$a_1$, while the selector 23b selector the inverse conversion table 24$b_1$ and routes 5-bit codewords "10000" or "01000" to the thus selected inverse conversion table 24$b_1$.

On the other hand, when i=2, for example, the selector 23a selects the inverse conversion table 24a and routes 10-bit codewords "00000 00000" or "00000 00100" to the thus selected inverse conversion table 24$a_2$, while the selector 23b selects the inverse conversion table 24$b_2$ and routes 10-bit codewords "00010 00000" or "'00001 00000" to the thus selected inverse conversion table 24$b_2$.

In a similar manner, when the constraint length $\underline{i}$ is 3 to 5, the selectors 23a, 23b select the inverse conversion tables 24$a_3$ to 24$a_5$ and 24$b_3$ to 24$b_5$ and routes 15 to 25 bit codewords to the selected inverse conversion tables 24$a_3$ to 24$a_5$ and 24$b_5$.

The inverse conversion tables 24$a_1$ to 24$a_5$ and 24$b_1$ to 24$b_5$ each have a 5–2, 10–4, 15–6, 20–8 and 25–10 inverse conversion, tables, and read out data of the data portions shown in table 4, using the codewords from the selectors 23a and 23b as the readout addresses.

The result is that, for the codewords "10000", "01000" and "00*00", the inverse conversion table 24b, outputs data "11" and "10" respectively, while the inverse conversion table 24$a_2$ outputs data "1011".

For the codewords "00010 00000", "00001 00000" and "00000 00*00", the inverse conversion table 24$b_2$ outputs data "0011" and "0010", while the inverse conversion "table 24$a_2$ outputs data "1011".

For the codewords "00010 00010 00010 00000", "00010 00001 00000", "00000 00001 00000", the inverse conversion table $24b_5$ outputs data "000111", "0001010", "00011".

For the codewords "00010 00010 00010 00000", "00010 00010 00001 00000", "00000 00000 00010 00*00", the inverse conversion table $24b_4$ outputs data "00001011", "00001010", - "00000101", while the inverse conversion table $24b_4$ outputs data "00000100" and "00000011".

For the codewords "00010 00010 00010 00010 00000", "00010 00010 00010 00001 00000, "00000 00000 00010 00001 00000", the inverse conversion table $24b_5$ outputs data "0000001101", "0000001010", "0000000000".

That is, 2×i bit data, as inverse converted from 5×i bit variable length codewords, are outputted from these inverse conversion tables $24a_1$, to $24a_5$ and $24b_1$, to $24b_5$ and routed to the multiplexors $25a$ and $25b$.

The multiplexors $25a$ and $25b$ multiplex the data routed from the inverse conversion tables $24a_1$, to $24a_5$ and $24b_1$, to $24b_5$ and transmit the resulting data as serial data to the buffer memory 26.

On the other hand, the PLL 27 reproduces clocks based upon the variable length codewords, and transmits the reproduced clocks to the buffer memory 26.

The buffer memory 26 temporarily stores data supplied thereto from the multiplexors $25a$, $25b$ and outputs the stored data at a preset rate as playback data in a timed relation to the clocks supplied thereto from the PLL 27. These output data are processed, for example, with inverse DCT, predictive decoding or the like, for reproducing video signals.

With the present demodulation apparatus, the variable length code including an unfixed codeword into data may be demodulated by detecting the codeword having the unfixed bit, determining the constraint length $i$ of the codeword of the variable length code based upon the results of detection, and inverse-converting the codeword into data based upon the constraint length $i$ with the aid of the inverse conversion tables for inverse converting the n×i bit variable length code into m×i bit data. With the present demodulating apparatus, similarly to the modulation apparatus, the inverse conversion tables $24a_1$ to $24b_5$ and $24b_1$ tl 255 and hence the circuit size may be reduced as compared to that of the VFM. In addition, since the maximum length between transitions $T_{max}$ may be diminished as compared to that of VFM, the PLL 27 may be improved in reliability.

What is claimed is:

1. A modulation method for converting data having a minimum run of 4 or more and a basic data length of $\underline{m}$ bits into a variable length code (d, k; m, n; r) having a basic code length of $\underline{n}$ bits, comprising setting an unfixed bit located at a preset position of a codeword that is capable of producing a maximum run $\underline{k}$ that is infinite, and determining said unfixed bit depending upon a codeword consecutive to said unfixed bit.

2. The modulation method as claimed in claim 1 comprising setting the unfixed bit to "1" when $\underline{d}$ or more bits are consecutive to said unfixed bit.

3. A modulation method for converting data having a minimum run of 4 or more and a basic data length of $\underline{m}$ bits into a variable length code (d, k; m, n; r) having a basic code length of $\underline{n}$ bits, comprising setting a bit at a preset position of a codeword which has the maximum number of "0"s consecutive thereto from its least significant bit towards the upper order bit side as an unfixed bit, and determining said unfixed bit depending upon a codeword consecutive to said unfixed bit.

4. A modulation apparatus for converting digital data having the basic data length equal to $\underline{m}$ bits into a variable length code (d, k; m, n; r) having the basic codeword length of $\underline{n}$ bits, comprising means for determining the constraint length $\underline{i}$ of said digital data, storage means in which conversion tables for converting said digital data into codewords of said variable length code having a minimum length between transitions $T_{min}$ of 2.0 T or longer and a minimum length $\underline{d}$ of the same consecutive symbols of 4 or more, T being the bit length of said digital data, are stored, and in which a bit at a preset position of a codeword among said codewords likely to give a maximum run $\underline{k}$ is previously set as being an unfixed bit, modulation means for converting said digital data into said variable length codewords, based upon the results of determination by said determining means, with the aid of said conversion tables, and unfixed bit processing means for determining said unfixed bit depending upon the next consecutive codewords if said unfixed bit is contained in the codeword produced by said modulation means.

5. The modulation apparatus as claimed in claim 4 wherein said storage means further sets a bit at a preset position of a codeword among the codewords in said conversion table which has the maximum number of "0"s consecutive thereto from its least significant bit towards the upper order bit side as being an unfixed bit.

6. The modulation apparatus as claimed in claim 5 wherein said unfixed bit is present between the least significant bit and the m'th bit of the variable length codeword and is such a bit as gives the least value of the maximum length between transitions $T_{max}$ if the bit is set to "1".

7. The modulation apparatus as claimed in claim 6 wherein said basic data length $\underline{m}$ is 2, the basic codeword length $\underline{n}$ is 5 and the maximum constraint length $\underline{r}$ is 5 or 10.

8. The modulation apparatus as claimed in claim 7 wherein if, for said maximum constraint length $\underline{r}$ equal to 6, said maximum length between transitions $T_{max}$ in said variable length code is 7.6 T, T being the bit length of said digital data.

9. The modulation apparatus as claimed in claim 7 wherein if, for said maximum constraint length $\underline{r}$ equal to 5, said maximum length between transitions $T_{max}$ in said variable length code is 8.0 T, T being the bit length of said digital data.

10. The modulation apparatus as claimed in claim 4 wherein said constraint length determining means determines the constraint length based upon a location within the conversion tables where a matching entry is found for the inputted digital data.

11. The modulation apparatus as claimed in claim 4 wherein said unfixed bit processing means determine said unfixed bit as being "1" when $\underline{d}$ or more "0" bits are consecutive to said unfixed bit.

12. A modulation apparatus for converting a variable length code (d, k; m, n; r) having the basic codeword length of $\underline{n}$ bits into digital data having the basic data length equal to $\underline{m}$ bits, comprising inverse conversion table storage means for storing inversion conversion tables inverse-converting said variable length codewords into said digital data, said variable length codewords including such codeword in which the minimum length between transitions $T_{min}$ is 2.0 T or longer, the minimum run $\underline{d}$ is 4 or longer and a bit at a preset position of the codeword likely to give the maximum run $\underline{k}$ equal to ∞ is set as being an unfixed bit, T being a bit length of the digital data, unfixed bit detection means for monitoring a string of said variable length codewords on the n-bit basis and for detecting whether or not a preset code pattern likely to have said unfixed bit is present in said string, unfixed bit determining means for determining, in accordance with the results of detection by said unfixed pattern detection means, to which code portion of said inverse conversion table corresponds a codeword having said unfixed bit, constraint length determining means for monitoring the string of said variable length codewords for determining the constraint length of said variable length code, and demodulating means for inverse converting said codewords into said digital data, based upon the results of decision of said unfixed codeword determining means and said constraint length determining means, with the aid of said inverse conversion tables, and outputting a resulting string of digital data.

13. The demodulation apparatus as claimed in claim 12 wherein said inverse conversion table storage means set a bit at a preset position of a codeword among the codewords in said inverse conversion tables which gives a maximum number of consecutive "0"s from the least significant bit towards the upper order bit side thereof.

14. The demodulation apparatus as claimed in claim 12 wherein said unfixed bit is positioned between the least significant bit and the m'th bit of the variable length codeword.

15. The demodulation apparatus as claimed in claim 14 wherein said basic data length $\underline{m}$ is 2, the basic codeword length $\underline{n}$ is 5 and the maximum constraint length $\underline{r}$ is 5 or 6.

16. The demodulation apparatus as claimed in claim 14 wherein if, for said maximum constraint length $\underline{r}$ equal to 6, said maximum length between transitions $T_{max}$ in said variable length code is 7.6 T, T being the bit length of said digital data.

17. The demodulation apparatus as claimed in claim 14 wherein if, for said maximum constraint length $\underline{r}$ equal to 5, said maximum length between transitions $T_{max}$ in said variable length code is 8.0 T, T being the bit length of said digital data.

\* \* \* \* \*

UNITED STATES PATENT AND TRADEMARK OFFICE
CERTIFICATE OF CORRECTION

PATENT NO. : 5,600,315
DATED : February 4, 1997
INVENTOR(S) : YOSHIHIDE SHIMPUKU ET AL.

It is certified that error appears in the above-indentified patent and that said Letters Patent is hereby corrected as shown below:

In Col. 16, line 40, delete the numeral "10" and replace with --6--.

Signed and Sealed this

Twentieth Day of May, 1997

Attest:

BRUCE LEHMAN

Attesting Officer    Commissioner of Patents and Trademarks